US012689305B2

(12) United States Patent　　　(10) Patent No.:　US 12,689,305 B2
Ugare et al.　　　　　　　　　　　 (45) Date of Patent:　　　Jul. 21, 2026

(54) DOUBLE-SIDE COOLED TRIPLE-DC-PORT HALF-BRIDGE POWER MODULE

(71) Applicant: BorgWarner US Technologies LLC, Wilmington, DE (US)

(72) Inventors: Chetan Ugare, Nuremberg (DE); Stefan Berindan, Nuremberg (DE); Andreas Apelsmeier, Pollenfeld (DE)

(73) Assignee: BorgWarner US Technologies LLC, Wilmington, DE (US)

( * ) Notice: Subject to any disclaimer, the term of this patent is extended or adjusted under 35 U.S.C. 154(b) by 173 days.

(21) Appl. No.: 18/749,913

(22) Filed: Jun. 21, 2024

(65) Prior Publication Data

US 2025/0392229 A1　　Dec. 25, 2025

(51) Int. Cl.
　　*H02M 7/00*　　　　(2006.01)
　　*H05K 7/20*　　　　(2006.01)
　　*H10W 44/00*　　　(2026.01)
　　*H10W 90/00*　　　(2026.01)

(52) U.S. Cl.
　　CPC ......... *H02M 7/003* (2013.01); *H10W 44/501* (2026.01); *H10W 90/00* (2026.01); *H05K 7/20909* (2013.01)

(58) Field of Classification Search
　　CPC .... H10W 90/00; H10W 44/501; H02M 7/003
　　See application file for complete search history.

(56)　　　　　　　References Cited

U.S. PATENT DOCUMENTS

| 2019/0067160 | A1 * | 2/2019 | Xu | ...................... | H10W 40/255 |
| 2019/0372063 | A1 * | 12/2019 | Xu | .......................... | B60R 16/04 |
| 2021/0280556 | A1 * | 9/2021 | Kato | .................... | H05K 1/0298 |
| 2023/0225044 | A1 | 7/2023 | Jeon et al. | | |

FOREIGN PATENT DOCUMENTS

| DE | 102021117924 | A1 * | 1/2023 | .......... | H10W 44/501 |
| GB | 2613794 | A | 6/2023 | | |
| GB | 2614045 | A * | 6/2023 | ............ | H10W 90/00 |
| WO | 2023285234 | A1 | 1/2023 | | |

* cited by examiner

*Primary Examiner* — Ryan Johnson

(74) *Attorney, Agent, or Firm* — Joshua M. Haines; Bookoff McAndrews, PLLC

(57)　　　　　　　ABSTRACT

Disclosed solutions relate to electrical inverters. An inverter may further include may include a power module including phase switches, a first negative DC power tab, and a second negative DC power tab. The first negative DC power tab and the second negative DC power tab are connected to one or more of the phase switches. The inverter may further include a positive DC power tab positioned between the first negative DC power tab and the second negative DC power tab and connected to the phase switches. The inverter may further include one or more phase AC power tabs to receive AC power from the phase switches.

19 Claims, 13 Drawing Sheets

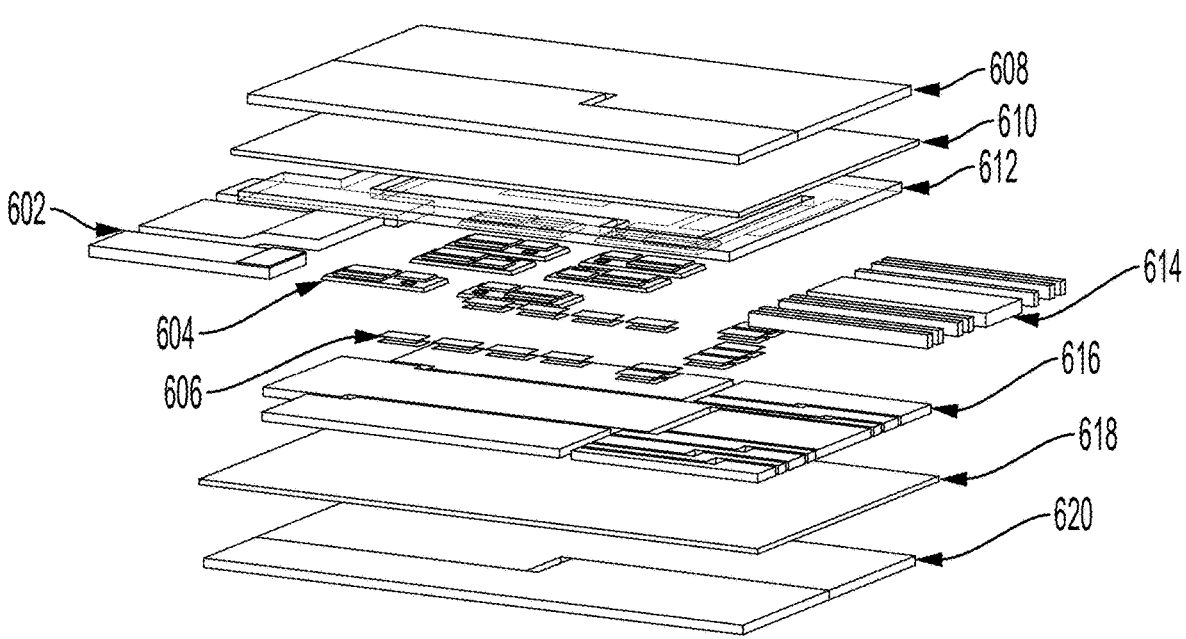
*FIG. 6*

DOUBLE-SIDE COOLED TRIPLE-DC-PORT HALF-BRIDGE POWER MODULE

TECHNICAL FIELD

Various embodiments of the present disclosure relate generally to electrical inverters, and more particularly, but without limitation, to electrical inverters used in high voltage circuits such as electric vehicle applications.

BACKGROUND

Electrical inverters are widely used in high voltage applications, such as in electric vehicles. For example, a power module including an inverter receives direct current (DC) and outputs one or more alternating current (AC) voltages according to various desired characteristics such as torque, power, and speed.

But inverters often struggle with various parasitic inductances which increase heat and reduce performance. The present disclosure is directed to overcoming one or more of these challenges.

SUMMARY OF THE DISCLOSURE

In some aspects, the techniques described herein relate to a system including: an inverter to convert DC power from a voltage source to AC power to drive a motor. The inverter includes: a power module including: phase switches; a first negative DC power tab; and a second negative DC power tab. The first negative DC power tab and the second negative DC power tab are connected to one or more of the phase switches. The inverter further includes a positive DC power tab positioned between the first negative DC power tab and the second negative DC power tab and connected to the phase switches. The inverter further includes one or more phase AC power tabs to receive AC power from the phase switches.

In some aspects, the techniques described herein relate to a system. The phase switches include a first group, a second group, and a third group. The first group is positioned adjacent to and is connected to the first negative DC power tab, the second group is positioned adjacent to and is connected to the positive DC power tab, and the third group is positioned adjacent to and is connected to the second negative DC power tab.

In some aspects, the techniques described herein relate to a system. The phase switches are positioned such that the first group and the third group are symmetrically arranged with respect to the positive DC power tab.

In some aspects, the techniques described herein relate to a system. A first path length from the first negative DC power tab via the phase switches to the positive DC power tab equals a second path length from the second negative DC power tab via the phase switches to the positive DC power tab.

In some aspects, the techniques described herein relate to a system. The power module includes a first side and a second side opposite the first side. The first negative DC power tab, the positive DC power tab, and the second negative DC power tab are positioned on the first side, and the one or more phase AC power tabs are positioned on the second side.

In some aspects, the techniques described herein relate to a system. The power module further includes a bottom substrate and a top substrate. The first negative DC power tab and the second negative DC power tab are positioned on the top substrate; and the positive DC power tab is positioned on the bottom substrate.

In some aspects, the techniques described herein relate to a system. The power module further includes a first metal spacer, a second metal spacer, a first die, a second die, and a third die. The first die connects a first portion of the top substrate to a first portion of the bottom substrate; the first metal spacer connects the first portion of the bottom substrate to a second portion of the top substrate; the second die connects the second portion of the top substrate to a second portion of the bottom substrate; the second metal spacer connects the second portion of the top substrate to a third portion of the bottom substrate; and the third die connects the third portion of the bottom substrate to a third portion of the top substrate.

In some aspects, the techniques described herein relate to a system. The phase switches are implemented on the first die, the second die, and the third die.

In some aspects, the techniques described herein relate to a system. The first metal spacer is positioned between the first die and the second die. The second metal spacer is positioned between the second die and the third die.

In some aspects, the techniques described herein relate to a system including a bottom substrate, a top substrate, and one or more metal spacers. The one or more metal spacers connect portions of the top substrate to the bottom substrate. The drain connections of one or more of the phase switches are connected to the bottom substrate.

In some aspects, the techniques described herein relate to a system in which the power module further includes an overmolding.

In some aspects, the techniques described herein relate to a system, further including: the voltage source to supply the DC power to the inverter; and the motor to receive the AC power from the inverter to drive the motor. The system is provided as a vehicle including the inverter, the voltage source, and the motor.

In some aspects, the techniques described herein relate to a system including an inverter to convert DC power from a voltage source to AC power to drive a motor. The inverter includes a power module including: phase switches; a first DC power tab and a second DC power tab. The first DC power tab and the second DC power tab are connected to the phase switches. The inverter further includes a third DC power tab positioned between the first DC power tab and the second DC power tab and connected to the phase switches and one or more phase AC power tabs to receive AC power from the phase switches.

In some aspects, the techniques described herein relate to a system. The first DC power tab is a positive DC power tab, the second DC power tab is a positive DC power tab, and the third DC power tab is a negative DC power tab.

In some aspects, the techniques described herein relate to a system. The first DC power tab is a negative DC power tab, the second DC power tab is a negative DC power tab, and the third DC power tab is a positive DC power tab.

In some aspects, the techniques described herein relate to a system, including a voltage source to supply the DC power to the inverter and a motor to receive the AC power from the inverter to drive the motor. The system is provided as a vehicle including the inverter, the voltage source, and the motor.

In some aspects, the techniques described herein relate to a system including a power module for an inverter, the power module including: phase switches; a first negative DC power tab; and a second negative DC power tab. The first negative DC power tab and the second negative DC power tab are connected to the phase switches. The power module further includes a positive DC power tab positioned between the first negative DC power tab and the second negative DC power tab and connected to the phase switches. The power module further includes one or more phase AC power tabs to receive AC power from the phase switches.

In some aspects, the techniques described herein relate to a system. The power module further includes a first side and a second side opposite the first side. The first negative DC power tab, the positive DC power tab, and the second negative DC power tab are positioned on the first side, and the one or more phase AC power tabs are positioned on the second side.

In some aspects, the techniques described herein relate to a system. The power module includes a bottom substrate and a top substrate. The first negative DC power tab and the second negative DC power tab are positioned on the top substrate and the positive DC power tab is positioned on the bottom substrate.

In some aspects, the techniques described herein relate to a system. The power module further includes a first metal spacer, a second metal spacer, a first die, a second die, and a third die. The first die connects a first portion of the top substrate to a first portion of the bottom substrate; the first metal spacer connects the first portion of the bottom substrate to a second portion of the top substrate; the second die connects the second portion of the top substrate to a second portion of the bottom substrate; the second metal spacer connects the second portion of the top substrate to a third portion of the bottom substrate; and the third die connects the third portion of the bottom substrate to a third portion of the top substrate.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, explain the principles of the disclosed embodiments.

FIG. 6 depicts various layers of an exemplary power module package, according to one or more embodiments.

DETAILED DESCRIPTION OF EMBODIMENTS

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of +10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section.

Various embodiments of the present disclosure relate generally to inverters, and more particularly, but without limitation, to inverter circuits used in high voltage circuits such as motors, or e-machines, in electric vehicles, and packages for inverter circuits.

As discussed above, electrical inverters are widely used in high voltage applications, such as for driving motors of electric vehicles. But inverters may suffer from commutation cell inductance (CCL), which increases switching losses and hence reduces the overall efficiency of the inverter. CCL may be a limiting factor with respect to higher switching speeds and hence may cause higher power losses.

One or more embodiments may address these concerns with inverters that use improved circuit design to divide routing of input AC current into symmetrical paths and/or employing metal spacers to conduct between different layers of substrates. As such, one or more embodiments may have three input DC tabs or ports rather than a traditional two-port solution. In so doing, one or more embodiments may reduce CCL losses and improve performance.

Figure 1:
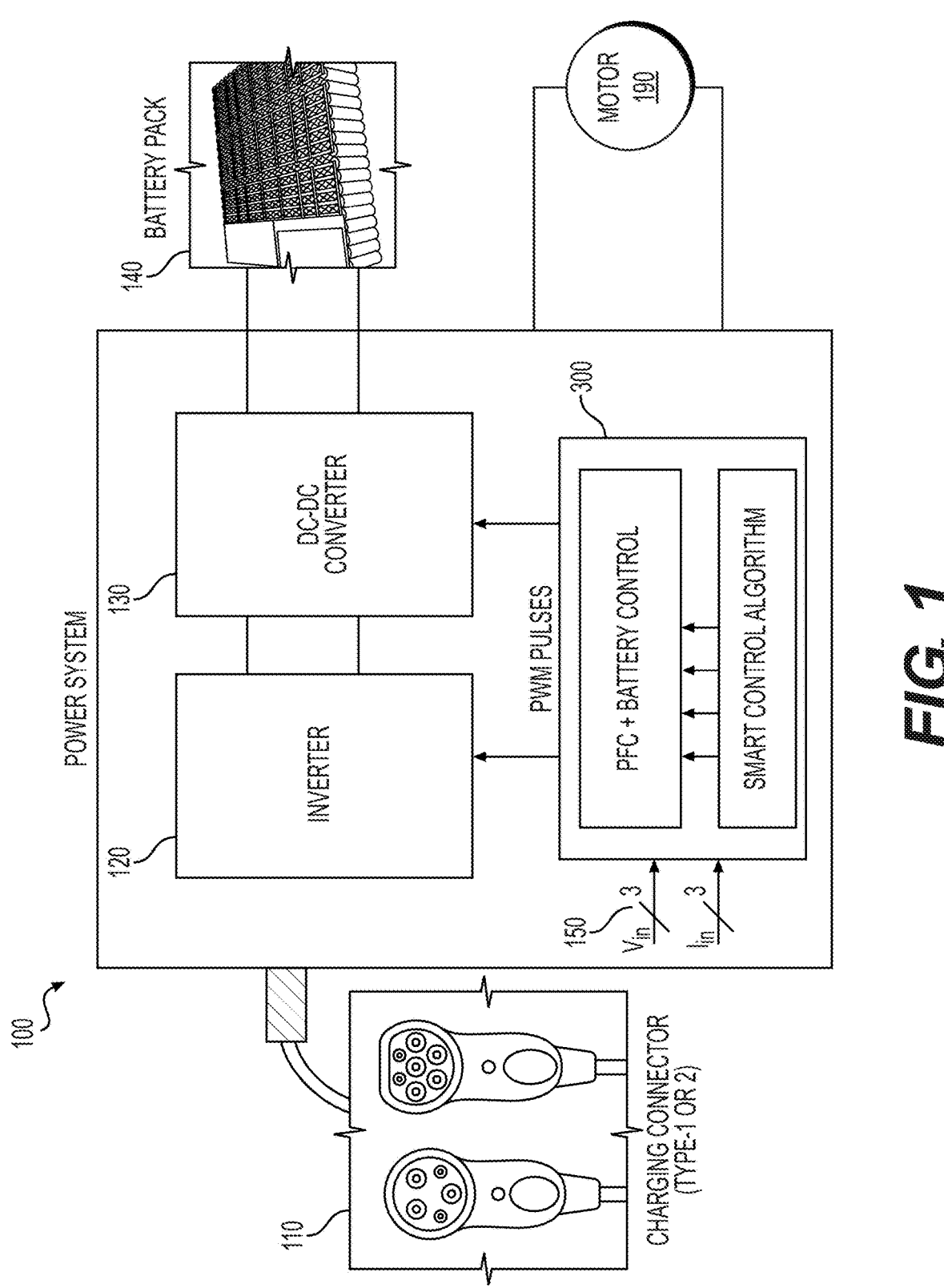
FIG. 1 depicts an exemplary system infrastructure for a power system for an electric vehicle, according to one or more embodiments.

FIG. 1 depicts an exemplary system infrastructure for a power system for an electric vehicle, according to one or more embodiments. As explained herein, power system 100 may perform functions such as charging battery pack 140 or powering an electric vehicle via motor 190.

As depicted in FIG. 1, power system 100 may include or be electrically connectable to a charging connector 110. The charging connector 110 may provide an electrical connection from an external power supply to the power system 100, and may be a Type 1 or a Type 2 connector, for example. The charging connector 110 may transfer single phase, two-phase, or three phase power.

The power system 100 may include one or more of an inverter 120, an HV DC-DC converter 130, and a controller 300 receiving signals from input sensor 150. Inverter 120 may convert DC, for example, provided by battery pack 140, to AC in one or more phases for driving motor 190. As explained herein, various inverter configurations are possible. For instance, power system 100 may include circuits as depicted herein. In some cases, power system 100 may include a Power Factor Correction (PFC) converter (not depicted). The PFC converter may be an AC-DC converter. HV DC-DC converter 130 may be a DC-DC converter.

Controller 300 may include one or more controllers such as processors. The power system 100 may include or be electrically connectable to a battery pack 140. The power system 100 may be used in automotive vehicles as an onboard charger to transfer power from an external power source through charging connector 110 to battery pack 140 in a grid-to-battery operation, or to transfer power from battery pack 140 in a vehicle to grid configuration (a battery-to-grid operation). The power system 100 may be included in a system provided as an electric vehicle including a motor 190 configured to rotate based on power received from the battery pack 140.

Figure 2:
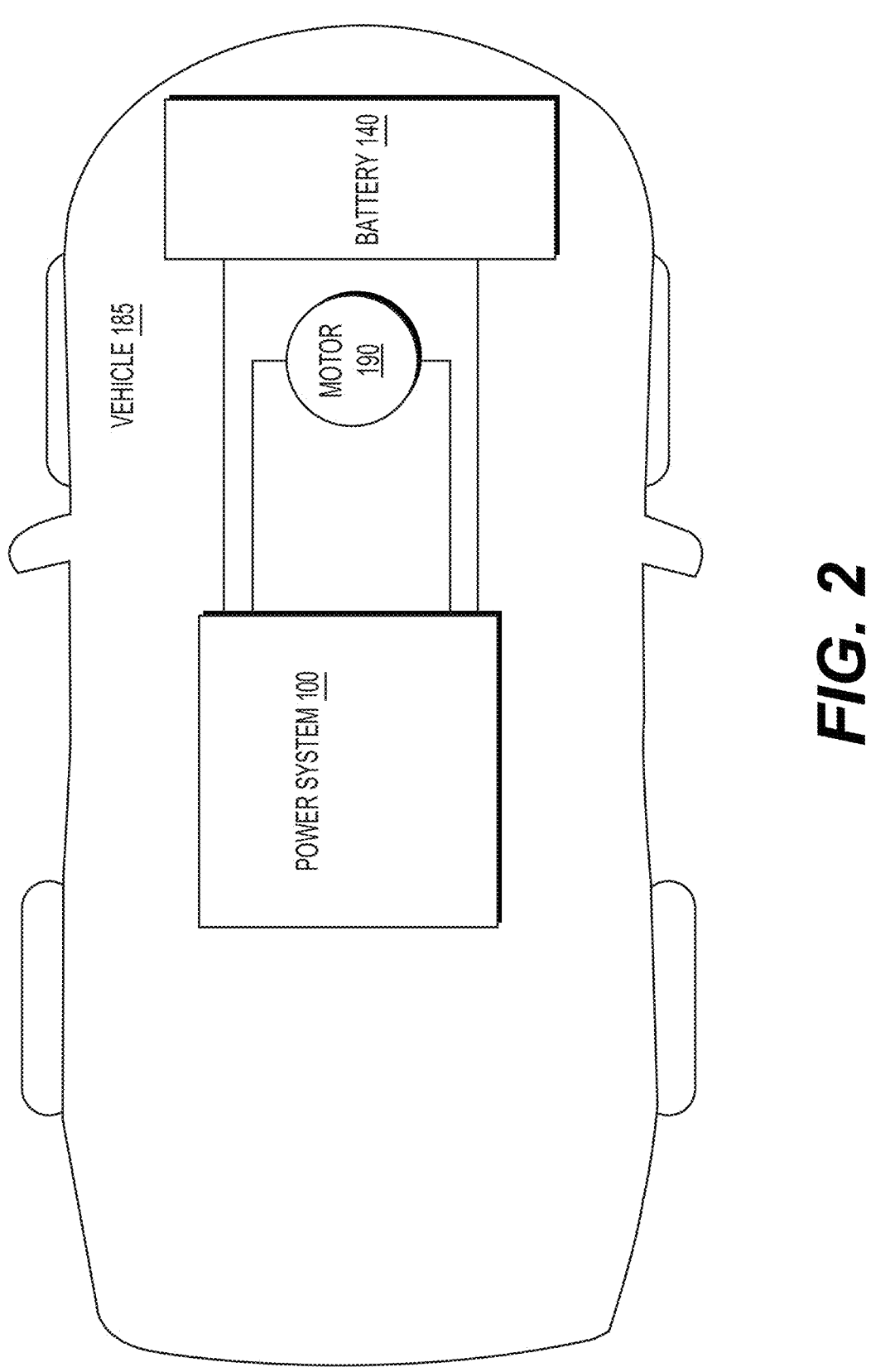
FIG. 2 depicts an exemplary system infrastructure for a vehicle including an inverter, according to one or more embodiments.

FIG. 2 depicts an exemplary system infrastructure for a vehicle including a battery charger, according to one or more embodiments. As discussed, power system 100 may include an inverter and/or a battery charger. As depicted in FIG. 2, electric vehicle 185 may include power system 100, motor 190, and battery pack 140.

Power system 100 may include components to receive electrical power from an external source and output electrical power to charge battery pack 140 of electric vehicle 185. Power system 100 may convert DC power from battery pack 140 in electric vehicle 185 to AC power, to drive motor 190 of the electric vehicle 185, for example, but the embodiments are not limited thereto. For example, power system 100 may include components to receive electrical power from an external source and output electrical power to charge battery pack 140 without motor 190 connected to power system 100. Power system 100 may convert DC power from battery pack 140 in electric vehicle 185 to AC power, to drive AC components other than motor 190 of the electric vehicle 185. Power system 100 may be bidirectional, and may convert DC power to AC power, or convert AC power to DC power, such as during regenerative braking, for example. Power system 100 may be a three-phase inverter, a single-phase inverter, or a multi-phase inverter.

Figure 3:
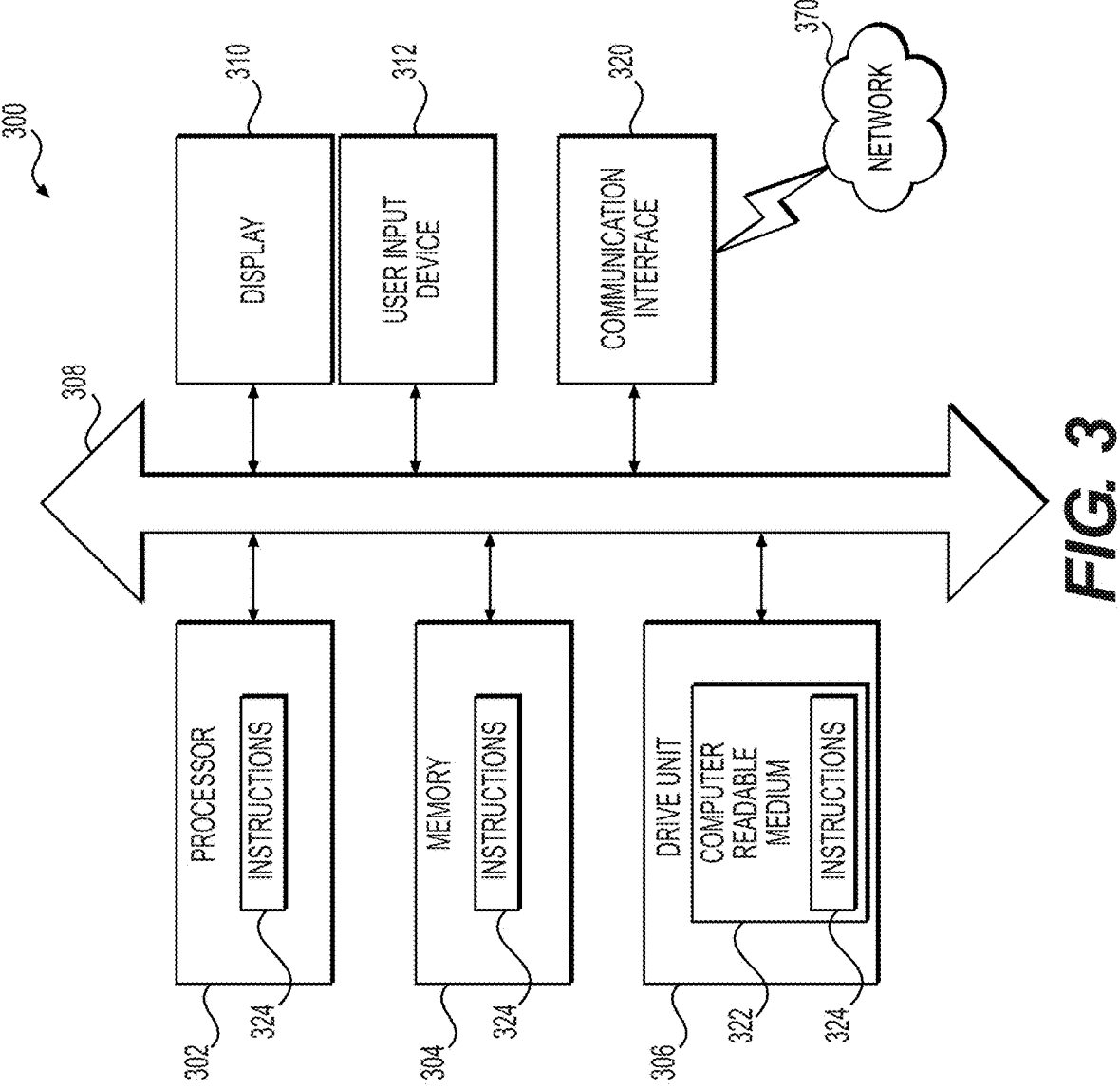
FIG. 3 depicts an implementation of a computer system that may execute techniques presented herein, according to one or more embodiments.

FIG. 3 depicts an implementation of a controller 300 that may execute techniques presented herein, according to one or more embodiments. For example, controller 300 may control one or more configurations of the circuits discussed herein.

Any suitable system infrastructure may be put into place to allow control of the battery charger. FIG. 3 and the following discussion provide a brief, general description of a suitable computing environment in which the present disclosure may be implemented. In one embodiment, any of the disclosed systems, methods, and/or graphical user interfaces may be executed by or implemented by a computing system consistent with or similar to that depicted in FIG. 3. Although not required, embodiments of the present disclosure are described in the context of computer-executable instructions, such as routines executed by a data processing device, e.g., a server computer, wireless device, and/or personal computer. Those skilled in the relevant art will appreciate that embodiments of the present disclosure can be practiced with other communications, data processing, or computer system configurations, including: Internet appliances, hand-held devices (including personal digital assistants ("PDAs")), wearable computers, all manner of cellular or mobile phones (including Voice over IP ("VoIP") phones), dumb terminals, media players, gaming devices, virtual reality devices, multi-processor systems, microprocessor-based or programmable consumer electronics, set-top boxes, network PCs, mini-computers, mainframe computers, and the like. Indeed, the terms "computer," "server," and the like, are generally used interchangeably herein, and refer to any of the above devices and systems, as well as any data processor.

Embodiments of the present disclosure may be embodied in a special purpose computer and/or data processor that is specifically programmed, configured, and/or constructed to perform one or more of the computer-executable instructions explained in detail herein. While embodiments of the present disclosure, such as certain functions, are described as being performed exclusively on a single device, the present disclosure may also be practiced in distributed environments where functions or modules are shared among disparate processing devices, which are linked through a communications network, such as a Local Area Network ("LAN"), Wide Area Network ("WAN"), and/or the Internet. Similarly, techniques presented herein as involving multiple devices may be implemented in a single device. In a distributed computing environment, program modules may be located in both local and/or remote memory storage devices.

Embodiments of the present disclosure may be stored and/or distributed on non-transitory computer-readable media, including magnetically or optically readable computer discs, hard-wired or preprogrammed chips (e.g., EEPROM semiconductor chips), nanotechnology memory, biological memory, or other data storage media. Alternatively, computer implemented instructions, data structures, screen displays, and other data under embodiments of the present disclosure may be distributed over the Internet and/or over other networks (including wireless networks), on a propagated signal on a propagation medium (e.g., an electromagnetic wave(s), a sound wave, etc.) over a period of time, and/or they may be provided on any analog or digital network (packet switched, circuit switched, or other scheme).

The controller 300 may include a set of instructions that may be executed to cause the controller 300 to perform any one or more of the methods or computer-based functions disclosed herein. The controller 300 may operate as a standalone device or may be connected, e.g., using a network, to other computer systems or peripheral devices.

In a networked deployment, the controller 300 may operate in the capacity of a server or as a client in a server-client user network environment, or as a peer computer system in a peer-to-peer (or distributed) network environment. The controller 300 may also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the controller 300 may be implemented using electronic devices that provide voice, video, or data communication. Further, while the controller 300 is illustrated as a single system, the term "system" shall also be taken to include any collection of systems or sub-systems that individually or jointly execute a set, or multiple sets, of instructions to perform one or more computer functions.

As illustrated in FIG. 3, the controller 300 may include a processor 302, e.g., a central processing unit (CPU), a graphics processing unit (GPU), or both. The processor 302 may be a component in a variety of systems. For example, the processor 302 may be part of a standard computer. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The controller 300 may include a memory 304 that may communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firmware, micro-code and the like, operating alone or in combination. Likewise, processing strategies may include multiprocessing, multitasking, parallel processing and the like.

As depicted, the controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the controller 300 may include an input device 312 configured to allow a user to interact with any of the components of controller 300. The input device 312 may be a number pad, a keyboard, or a cursor control device, such as a mouse, or a joystick, touch screen display, remote control, or any other device operative to interact with the controller 300.

The controller 300 may also or alternatively include drive unit 306 implemented as a disk or optical drive. The drive unit 306 may include a computer-readable medium 322 in which one or more sets of instructions 324, e.g. software, may be embedded. Further, the instructions 324 may embody one or more of the methods or logic as described herein. The instructions 324 may reside completely or partially within the memory 304 and/or within the processor 302 during execution by the controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 may communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in controller 300, or combinations thereof. The connection with the network 370 may be a physical connection, such as a wired Ethernet connection or may be established wirelessly as discussed below. Likewise, the additional connections with other components of the controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory and may be tangible.

The computer-readable medium 322 may include a solid-state memory such as a memory card or other package that houses one or more non-volatile read-only memories. The computer-readable medium 322 may be a random-access memory or other volatile re-writable memory. Additionally or alternatively, the computer-readable medium 322 may include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, may be constructed to implement one or more of the methods described herein. Applications that may include the apparatus and systems of various implementations may broadly include a variety of electronic and computer systems. One or more implementations described herein may implement functions using two or more specific interconnected hardware modules or devices with related control and data signals that may be communicated between and through the modules, or as portions of an application-specific integrated circuit. Accordingly, the present system encompasses software, firmware, and hardware implementations.

The controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations may include distributed processing, component/object distributed processing, and parallel processing. Alternatively, virtual computer system processing may be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, and HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the steps of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

As mentioned above, certain aspects relate to improved inverters and power modules that reduce parasitic inductance and improve performance relative to existing systems. FIGS. 4-13 discuss examples of these improved inverters.

Figure 4:
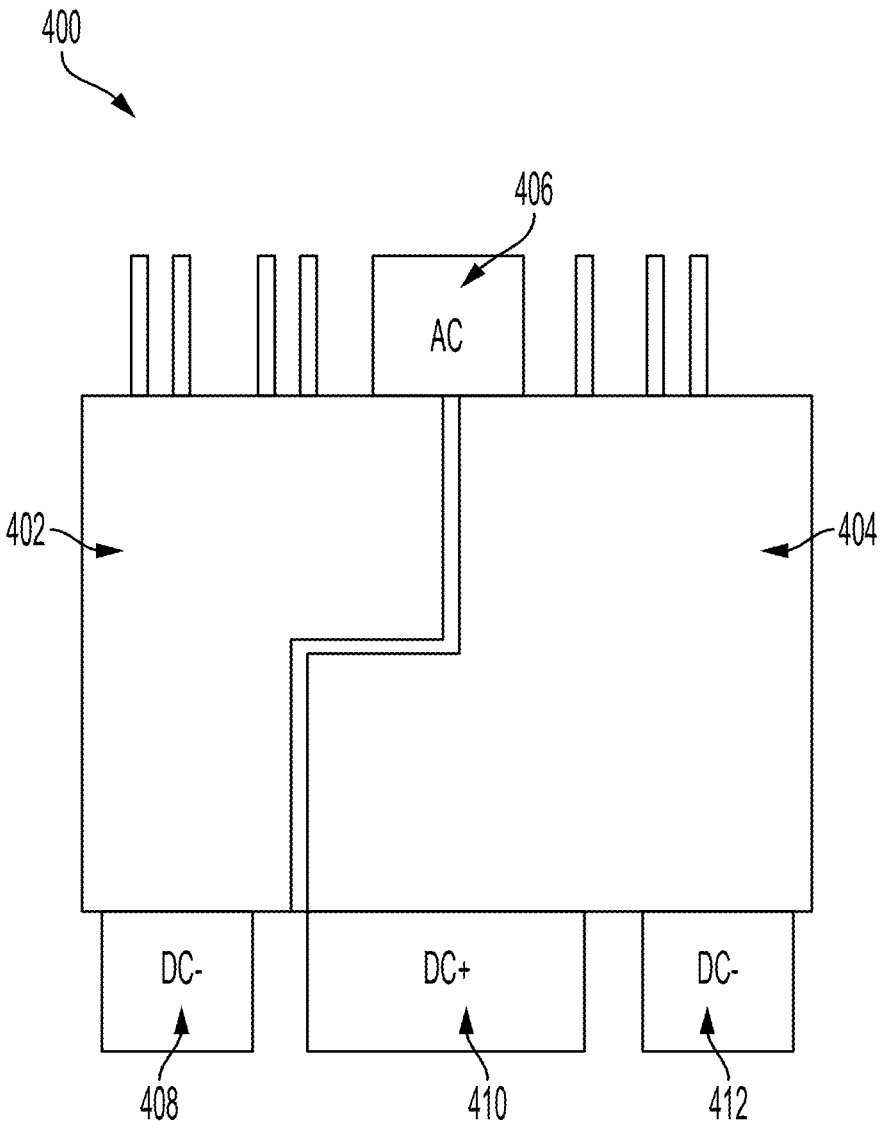
FIG. 4 depicts an exemplary power module package, according to one or more embodiments.

FIG. 4 depicts an exemplary power module package 400, according to one or more embodiments. Power module package 400 may include AC power tab 406, negative DC power tab 408, positive DC power tab 410, and negative DC power tab 412. In some cases, one or more of these tabs may be connected to a power rail. For instance, negative DC power tab 408 and negative DC power tab 412 may be interconnected internally (e.g. using a negative DC power rail), and positive DC power tab 410 may be connected to a positive DC power rail.

In the example depicted, one or more phase switches implemented on one or more dies within power module package 400 perform the DC to AC power conversion. The phase switches may be used to apply pulse width modulated voltage in controlling the output voltage, which in turn may be applied to inductive loads such as motors. The dies may be divided into two or more current pathways on a DC-side of the power module (not considering the output AC side). The pathways may be connected in such a manner that a length of a first pathway between the negative DC power tab 408 and positive DC power tab 410 is equal or approximately equal to a length of a second pathway between negative DC power tab 412 and positive DC power tab 410.

In an example, power module package 400 receives DC power, from a voltage source, via negative DC power tab 408, positive DC power tab 410, and negative DC power tab 412. In turn, the phase switches convert the DC power to AC power and power module package 400 outputs the AC power to AC power tab 406. In some cases, one or more of negative DC power tab 408, positive DC power tab 410, and negative DC power tab 412 may be connected to a bulk capacitor.

As further discussed herein, power module package 400 may include one or more substrates, metal spacers, metal layers, dielectrics, and so forth. For instance, the phase switches may be mounted on the substrates, and connect with each other and/or the inputs and outputs via the metal layers and metal spacers. As depicted, one or more layers of power module package 400 are divided into two sections 402 and 404. But other divisions are possible.

Power module package 400 may have one or more associated control pins or tabs. For example, by applying voltages to one or more of the associated control pins, an operation of the phase switches within power module package 400 may be adjusted. For instance, parameters of the phase switches may be adjusted such as switching frequency, PWM width, output voltage, and so forth. Further, power module package 400 may include one or more temperature pins that output signals from one or more temperature sensors positioned within power module package.

Figure 5:
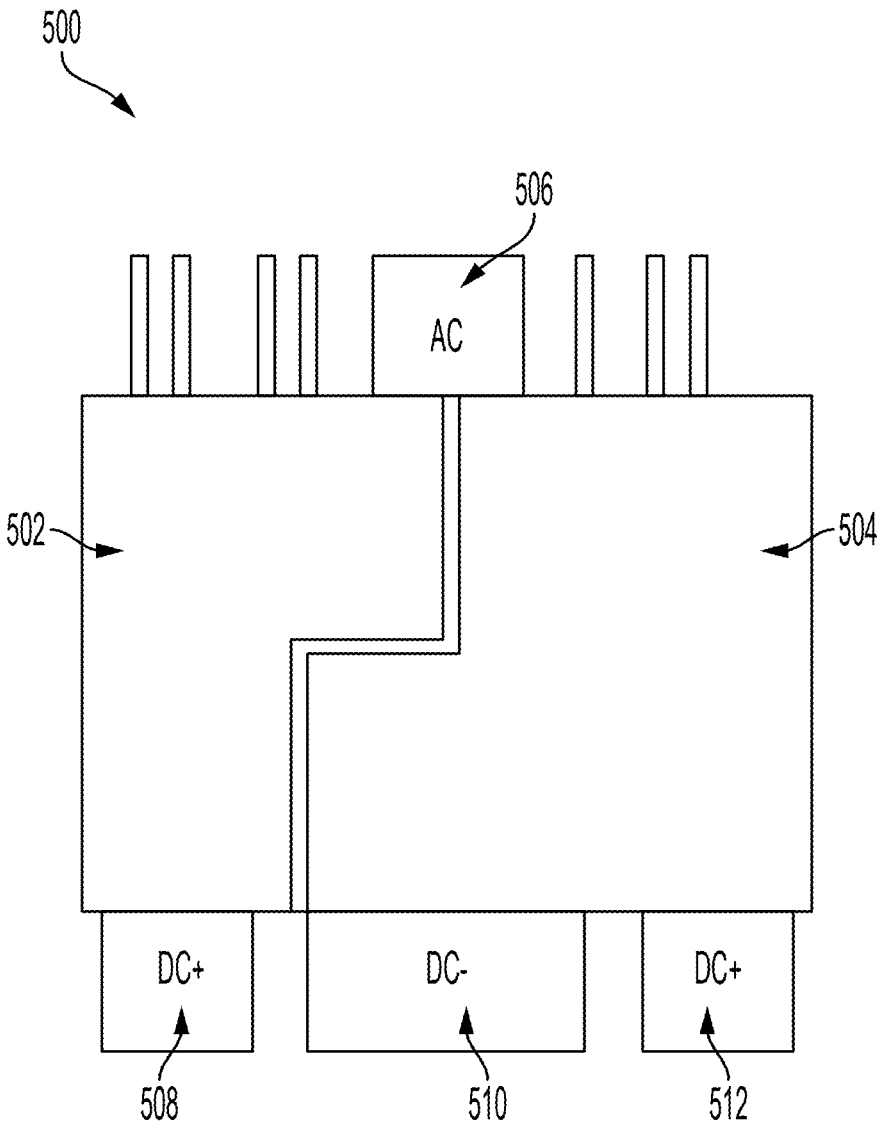
FIG. 5 depicts an exemplary power module package, according to one or more embodiments.

FIG. 5 depicts an exemplary power module package 500, according to one or more embodiments. Power module package 500 may include sections 502 and 504, positive DC power tab 508, negative DC power tab 510, positive DC power tab 512, and AC power tab 406.

As depicted, power module package 500 includes two positive DC tabs and one negative DC tab, as compared to power module package 400 which includes two negative DC tabs and one positive DC power tab. Power module package 500 also has symmetrical current paths, but operates with a reverse signal flow as compared to power module package 400.

In the example depicted, one or more phase switches within power module package 500 receive DC power via positive DC power tab 508, negative DC power tab 510, and positive DC power tab 512. In turn, the phase switches convert the DC power to AC power. Power module package 500 outputs the AC power to AC power tab 506. In some cases, one or more of these tabs may be connected to a bulk capacitor.

FIG. 6 depicts various layers of an exemplary power module package 600, according to one or more embodiments. As depicted, power module package 600 includes various layers, each of which may perform one or more specific functions, as further discussed herein.

The power modules described herein such as power module package 600 may leverage various technologies such as "flex on substrate" (FoS). A substrate is a non-conductive material that provides mechanical support and electrical insulation for the components and conductive traces. FoS may allow a full use of the source thermal path by using openings in a dielectric to directly make a connection to the bottom substrate and may employ thin layers of polyimide routed under a die to make gate connections without interference with source connections. Disclosed power modules may also leverage features such as overmolded exteriors, as well as various features such as electrically conductive metal spacers, vias, and surface mounted thermistors.

Power module package 600 depicts an exploded view of the layers without the optional over molding surrounding, e.g., extending around an outer surface of, the package. Power module package 600 includes DC tabs 602, die 604, metal spacers 606, top exterior substrate 608, top ceramic 610, source substrate 612 with second metal layer, AC lead and signal pins 614, and base substrate 616, bottom ceramic 618, and bottom exterior substrate 620. Examples of suitable dies include, but are not limited to, Silicon Carbide (SiC) metal-oxide-semiconductor field-effect (MOSFET) dies, insulated-gate bipolar transistor (IGBT) dies, and Silicon (Si) MOSFET dies. Examples of top ceramics 610 and bottom ceramics 618 include, but are not limited to, Silicon Nitride ceramics.

Inverter package 600 may include various tabs for connections to external devices. For example, DC tabs 602 include leads such as negative DC power tab 408, positive DC power tab 410, and negative DC power tab 412, as depicted in FIG. 4. Power module package 600 may an include AC lead and signal pins 614.

Power module package 600 may include one or more SiC MOSFET dies 604. Using silicon carbide transistors may result in reduced the switching times relative to, for example, some silicon insulated gate bipolar transistors (Si IGBT).

Power module package 600 may include one or more metal spacers 606. As discussed, metal spacers conduct electricity between the various layers. Exemplary current flow using spacers is discussed further with respect to FIGS. 8 and 10.

Metal spacers 606 provide substrate-to-substrate connections and may resolve assembly challenges including heat and current paths. The metal spacers 606 may be formed of copper, for example, or another electrically and/or thermally conductive material. The metal spacers may provide a connection between a first substrate and a second substrate, thereby conducting current between substrates. In an example, a metal spacer is approximately 2 mm by approximately 2 mm, and may have a thickness similar to that of a die, such as approximately 180 μm, for example. The metal spacers may be surface mount components and placed along with SiC MOSFETS using a same process. The metal spacers may replace wires and clips that some systems may use, and die interconnects may allow the gate, drain, and source to be connected to the same substrate.

In an aspect, power module package 600 may include one or more surface-mount components such as, for example, a temperature sensor, thermistor, capacitor, resistor, or another integrated circuit (IC), such as a gate driver, etc. For example, a temperature measurement from a thermistors may be provided to controller 300. In turn, controller 300 may take one or more actions such as adjusting current, changing winding configuration, sending an alert, and so forth.

Power module package 600 may include one or more substrates such as top exterior substrate 608, source substrate 612, Base substrate 616, and bottom exterior substrate 620. Source substrate 612 may have a metal layer. But other substrates are possible. The substrates used within power module package 600 may have a thermally conductive interface to both sides of a SiC die. In an example, sources are connected to the underlying plane while the gate interconnect is to the flex circuit on second metal. The drains may be connected to the opposing substrate plane. Interconnect may be done with soldering or sintering.

Power module package 600 may include one or more ceramic layers. As depicted, power module package 600 includes top ceramic 610 and bottom ceramic 618.

In some devices, having components placed on both a top and a bottom of a substrate, during assembly, the two substrates must be joined, face-to-face, such that necessary electrical connections between the components on the top substrate and bottom substrate are made. For example, connections between gates may be only 1 millimeter by 1 millimeter, requiring precise alignment of the top substrate and bottom substrate. Improper registration during assembly may lead to production loss and higher costs. Therefore, the power module assembled may provide all components placed on a substrate, thereby avoiding issues of improper registration during assembly when a top substrate is joined to a bottom substrate.

Figure 7:
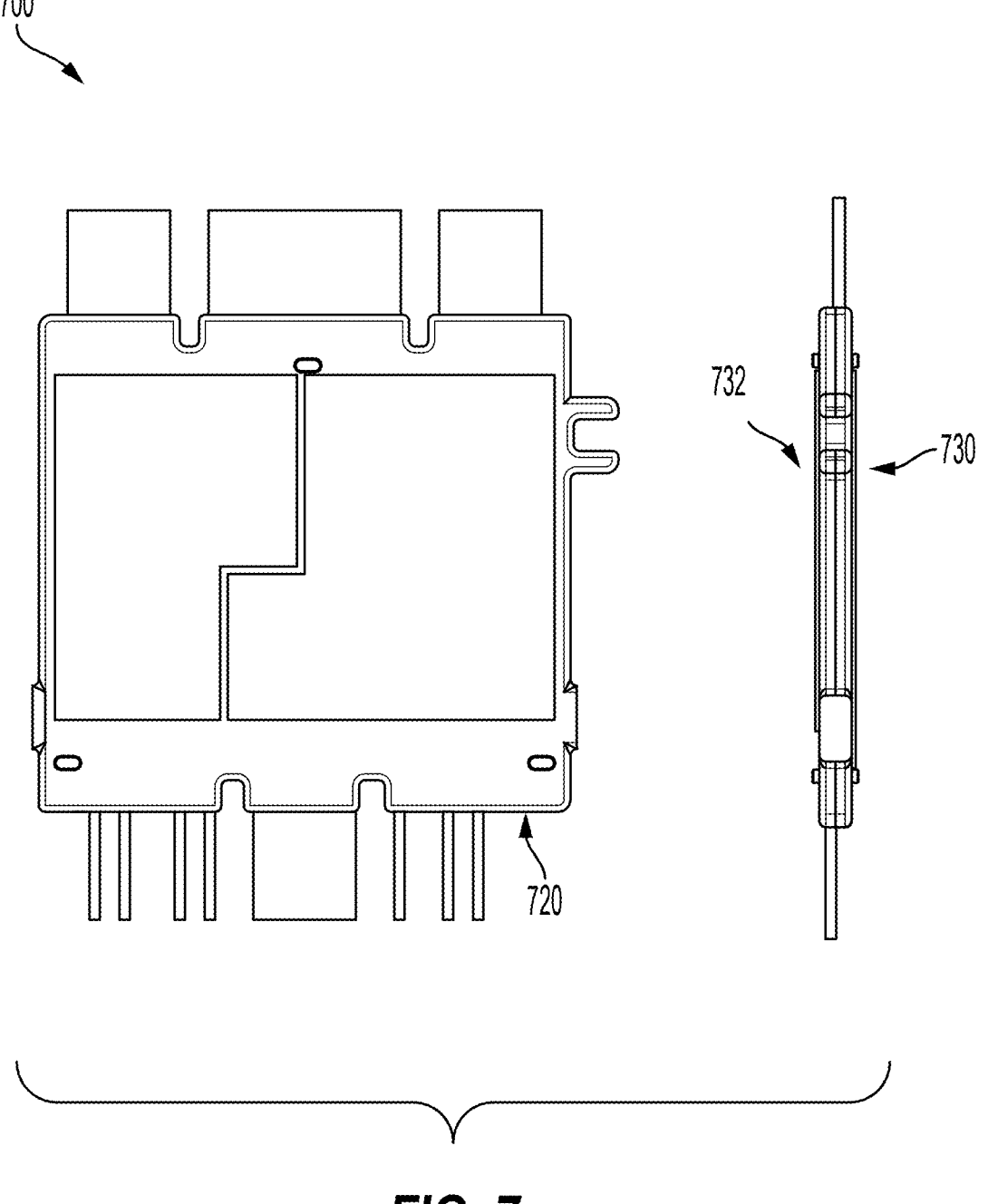
FIG. 7 depicts an exemplary power module package, according to one or more embodiments.

FIG. 7 depicts an exemplary power module package 700, according to one or more embodiments. Power module package 700 includes molding 720, heatsink contact area 730, and heatsink contact area 732. As depicted, power module package 700 may also include various voltage and signal tabs. Molding 720 serves to protect the power module package in harsh or rugged environments such as electric vehicles. Further, power module package 700 includes heatsink contact areas 730 and 732, which facilitate cooling on both sides of the package.

Figure 8:
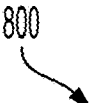
FIG. 8 depicts an exemplary current flow within a power module package, according to one or more embodiments.

FIG. 8 depicts an exemplary current flow within a power module package 800, according to one or more embodiments. Power module package 800 includes AC tab 806; negative DC power tab 808; positive DC power tab 810; negative DC power tab 812; and phase switch groups 820, 822, 824, and 826. Power module package 800 uses a drain down configuration with second metal layer for symmetric gate signal routing.

In the example depicted, phase switch groups 820, 822, 824, and 826 receive DC input from negative DC power tab 808, positive DC power tab 810, and negative DC power tab 812, convert the DC voltages into an AC voltage according to parameters set by various control signal pins, and output the AC voltage to AC tab 806.

As depicted, phase switch group 820 is located near or adjacent to negative DC power tab 808. Phase switch group 822 and phase switch group 824 are located near or adjacent to positive DC power tab 810. Phase switch group 826 is located near or adjacent to negative DC power tab 812. In some cases, phase switch groups 822 and 824 may be a single group of phase switches.

The phase switch groups facilitate an exemplary current flow on a DC-side of the power module (not considering the AC side). For example, the current may flow from positive DC power tab 810 to negative DC power tabs 808 and 812. For example, a first flow is shown between positive DC power tab 810, through path 830, path 832, spacer 834, path 836, path 838, and to negative DC power tab 808. A second flow is shown between positive DC power tab 810, through path 830, path 842, spacer 844, path 846, path 848, and to the negative DC power tab 812.

In an example, current from positive DC power tab 810 flows into the power module at path 830, through one or more phase switches within phase switch group 822, and is split into two paths, path 832 and 842. Continuing the example, current flows at via path 832, through spacer 834, to another layer of substrate, and continues via path 836 and path 838 through phase switches within phase switch group 826 before being output at negative DC power tab 808. Similarly, current flows via path 842, through spacer 844, to another layer of substrate, and continues via path 846 and path 848, through phase switches within phase switch group 826 before being output at negative DC power tab 812.

The current flows are two symmetrical paths with a line of symmetry approximately bisecting AC tab 806, being between phase switch groups 822 and 824, and approximately bisecting positive DC power tab 810. With this symmetrical layout, the current paths are split and parasitic inductances may be reduced. Paths from negative DC power tab 808 to positive DC power tab 810 and from to positive DC power tab 810 to negative DC power tab 812 may be reduced. In some examples, such paths are substantially or approximately equal in length.

In some aspects, power module package 800 may have a connection 840 between negative DC power tab 808 and negative DC power tab 812. This may reduce ringing.

Figure 9:
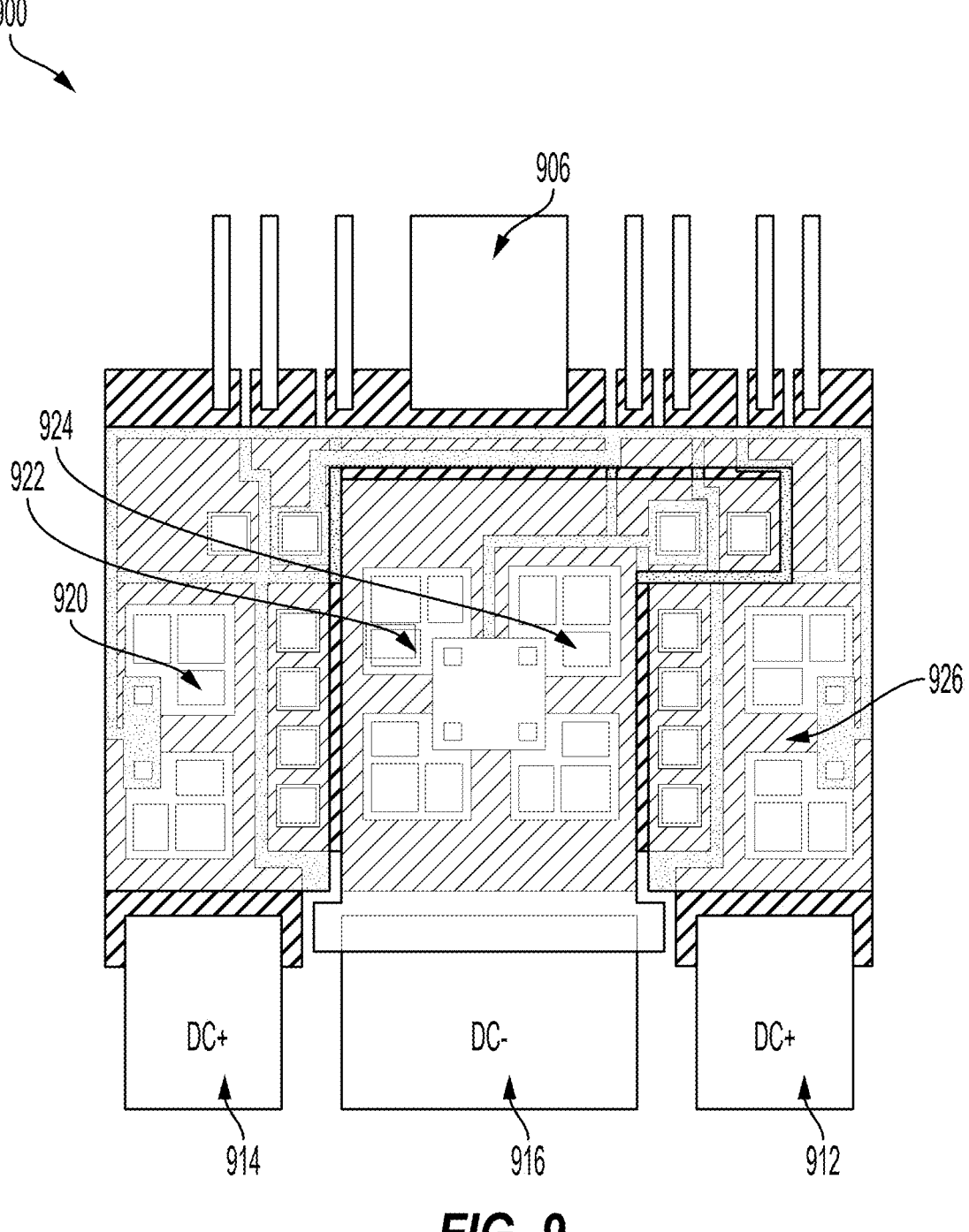
FIG. 9 depicts an exemplary layout for a power module package, according to one or more embodiments.

FIG. 9 depicts an exemplary layout for a power module package 900, according to one or more embodiments. Relative to power module package 800 discussed with respect to FIG. 8, power module package 900 includes a reversed current flow while maintaining a drain down configuration with second metal layer for symmetric gate signal routing. Power module package 900 includes AC tab 906, positive DC tab 914, negative DC tab 916, positive DC tab 912, and phase switch groups 920, 922, 924, and 926.

In the example depicted, phase switch groups 920, 922, 924, and 926 receive DC input from positive DC tab 914, negative DC tab 916, and positive DC tab 912, convert the DC voltages into an AC voltage according to parameters set by various control signal pins, and output the AC voltage to AC tab 906. In some cases, phase switch groups 922 and 924 may be a single group of phase switches.

Figure 10:
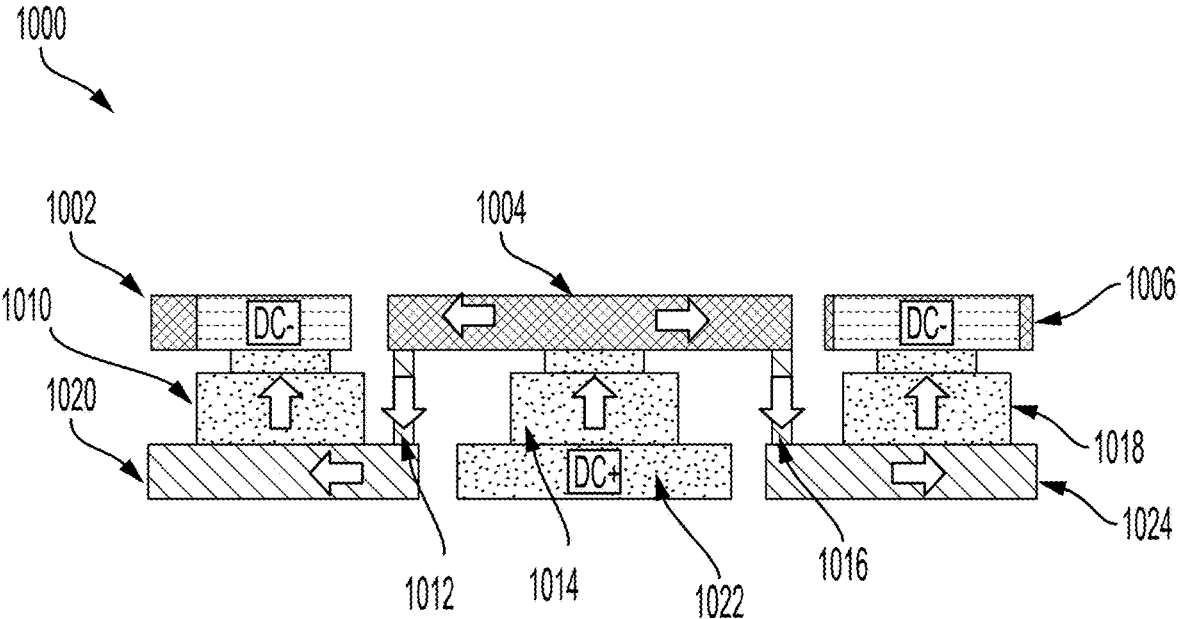
FIG. 10 depicts an exemplary current flow within a power module package, according to one or more embodiments.

FIG. 10 depicts an exemplary commutation current flow within a commutation cell of a power module package 1000, according to one or more embodiments. FIG. 10 depicts a current flow between layers of substrate within power module package 1000. Power module package includes a first portion of the top substrate 1002, a second portion of the top substrate 1004, a third portion of the top substrate 1006, first die group 1010, second die group 1014, third die group 1018, first metal spacer group 1012, second metal spacer group 1016, a first portion of the bottom substrate 1020, a second portion of the bottom substrate 1022, and a third portion of the bottom substrate 1024.

Each of first die group 1010, second die group 1014, and third die group 1018 may include one or more phase switches, and may collectively perform voltage inversion. In some aspects, source connections of the one or more phase switches are connected to the top substrate and drain connections of one or more phase switches are connected to the bottom substrate. Other configurations are possible.

The first portion of the top substrate 1002 includes a first negative DC power tab. The third portion of the top substrate 1006 includes a second negative DC power tab. The negative DC power tabs are connected to their respective substrate portions.

As depicted, the dies and metal spacers facilitate use of multiple layers of substrate. For example, first die group 1010 connects the first negative DC power tab, which is on a first portion of the top substrate 1002, to a first portion of the bottom substrate 1020. First metal spacer group 1012 connects the first portion of the bottom substrate 1020 to second portion of the top substrate 1004. Second die group 1014 connects the second portion of the top substrate 1004 to the positive DC power tab on second portion of the bottom substrate 1022. Second metal spacer group 1016 connects the second portion of the top substrate 1004 to third portion of the bottom substrate 1024. Third die group 1018 connects the third portion of the bottom substrate 1024 to third portion of top substrate 1006 in addition to the second negative power tab.

Current may follow one or more paths through power module package 1000. For instance, as depicted, the commutation cell current flows from the second portion of the bottom substrate 1022, via second die group 1014, to top substrate 1004. From top substrate 1004, current flows down first metal spacer group 1012 to bottom substrate 1020. From bottom substrate 1020, the commutation cell current flows through first die group 1010 to DC negative power tab located on the first portion of the top substrate 1002. Further, from top substrate 1004, the commutation cell current flows through second metal spacer group 1016 to bottom substrate 1024. From bottom substrate 1024, current flows through third die group 1018 to third portion of the top substrate 1006.

In some aspects, a flipped die arrangement is used. With a flipped die arrangement, the parasitic inductances of metal spacers are further reduced.

Figure 11:
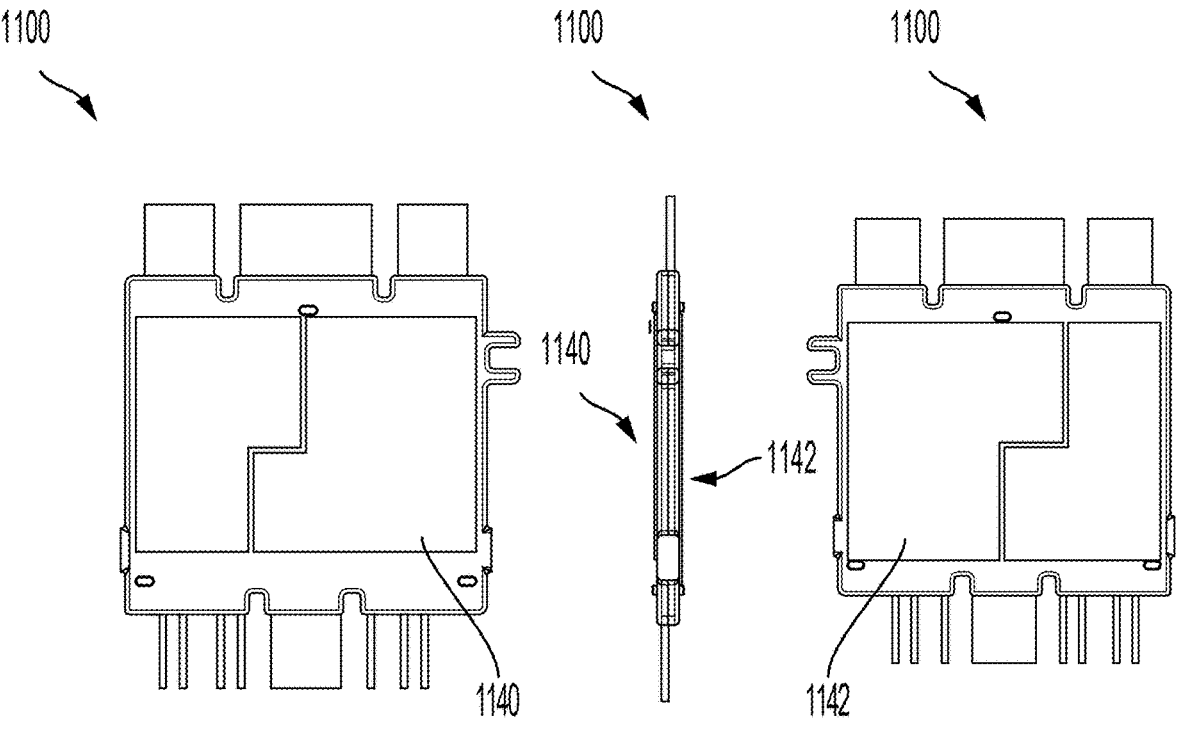
FIGS. 11A-C depict heat sink contact areas for an exemplary power module package, according to one or more embodiments.

FIG. 11A-C depict heat sink contact areas for an exemplary power module package 1100, according to one or more embodiments. FIG. 11 includes power module package 1100, viewed from different perspectives. For example, FIG. 11A depicts power module package 1100 having a heatsink contact area 1140. FIG. 11C depicts an opposite side of power module package 1100 from FIG. 11A, having a heatsink contact area 1142. FIG. 11B depicts a side view of power module package 1100 with heatsink contact areas 1140 and 1142.

Figure 12:
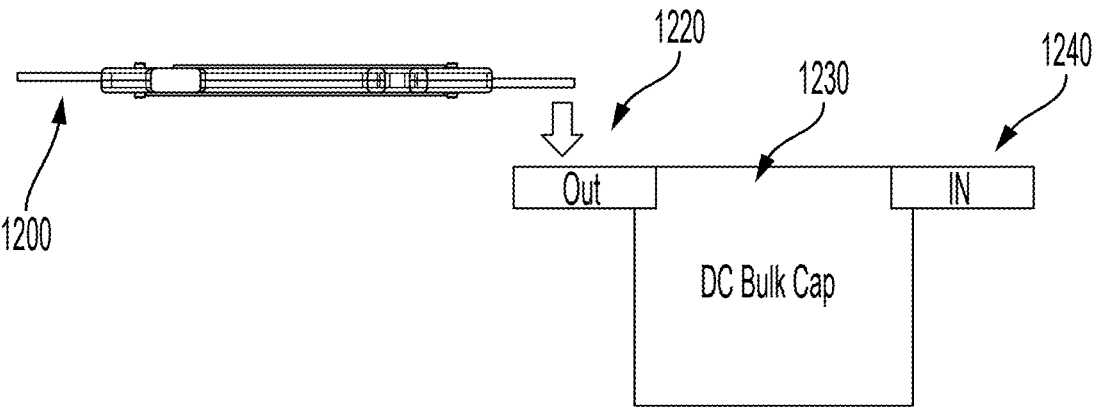
FIG. 12 depicts an exemplary mounting of a power module package with a bulk capacitor, according to one or more embodiments.

FIG. 12 depicts an exemplary mounting of a power module package with a bulk capacitor, according to one or more embodiments. FIG. 12 depicts power module package 1200, connected to an output tab 1220 of bulk capacitor 1230. During operation, current received at input tab 1240 is passed through the bulk capacitor 1230 to the output tab 1220 to the power module package 1200. FIG. 12 depicts an example of top down mounting.

One or more embodiments may provide several advantages relative to some solutions. For instance, one or more embodiments may realize a reduction of power switch parasitic inductance, which may enable higher switching speeds. In combination with a bulk capacitor, the reduced parasitic inductances may enable Electromagnetic Compatibility (EMC) compliance with reduced efforts. One or more embodiments may enable a reduction of a number of power switches.

Figure 13:
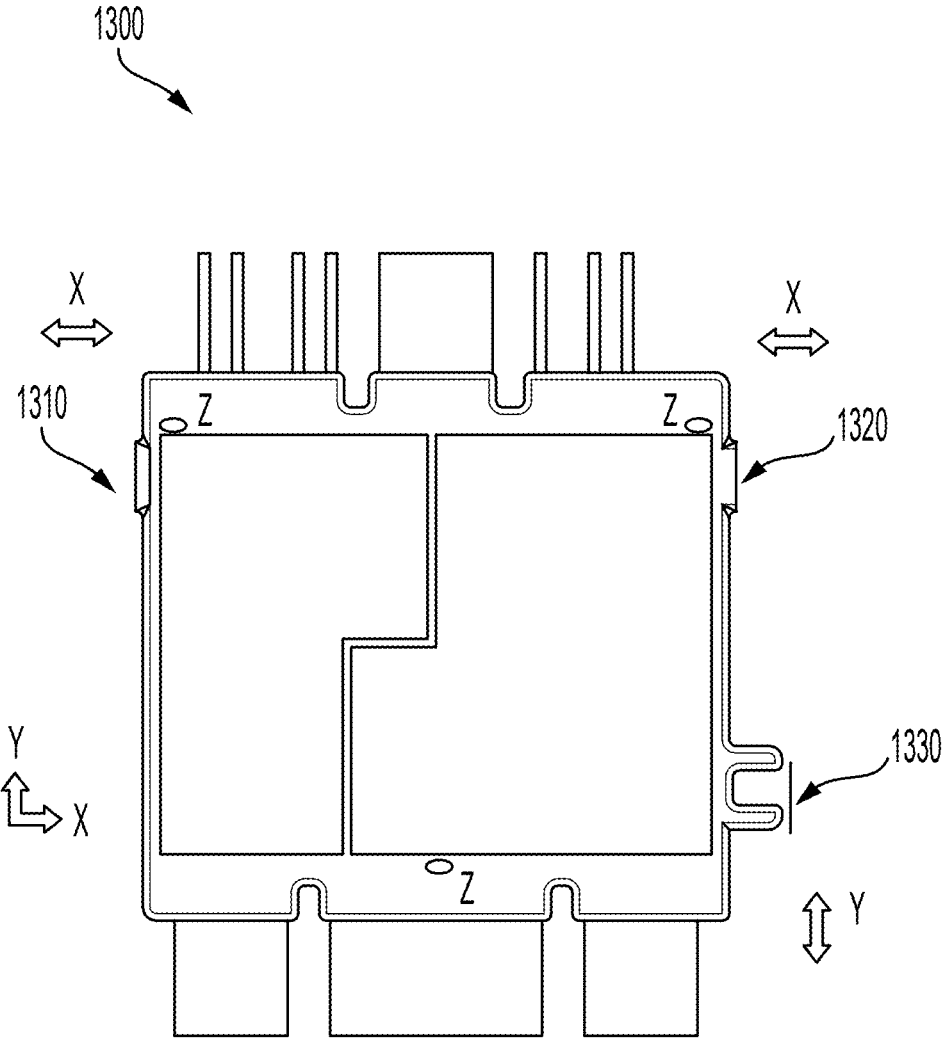
FIG. 13 depicts physical support rims for an exemplary power module package, according to one or more embodiments.

FIG. 13 depicts physical support rims for an exemplary power module package 1300, according to one or more embodiments. Power module package 1300 is shown with support rims 1310, 1320, and 1330 that may assist with placement and alignment of power module package 1300 in coordinate systems X, Y, and Z.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

The invention claimed is:

1. A system comprising:
an inverter to convert DC power from a voltage source to AC power to drive a motor, wherein the inverter includes:
a power module comprising:
phase switches;
a first negative DC power tab;
a second negative DC power tab, wherein the first negative DC power tab and the second negative DC power tab are connected to one or more of the phase switches;
a positive DC power tab positioned between the first negative DC power tab and the second negative DC power tab and connected to the phase switches; and
one or more phase AC power tabs to receive AC power from the phase switches,
wherein the phase switches comprise a first group, a second group, and a third group,
wherein:
the first group is positioned adjacent to and is connected to the first negative DC power tab,
the second group is positioned adjacent to and is connected to the positive DC power tab,
the third group is positioned adjacent to and is connected to the second negative DC power tab,
a first distance between the first group and the first negative DC power tab is the same as a second distance between the third group and the second negative DC power tab, and
the first distance and the second distance are shorter than a third distance between the second group and the positive DC power tab.

2. The system of claim 1, wherein the phase switches are positioned such that the first group and the third group are symmetrically arranged with respect to the positive DC power tab.

3. The system of claim 1, wherein a first path length from the first negative DC power tab via the phase switches to the positive DC power tab equals a second path length from the second negative DC power tab via the phase switches to the positive DC power tab.

4. The system of claim 1, wherein the power module comprises a first side and a second side opposite the first side, and wherein the first negative DC power tab, the positive DC power tab, and the second negative DC power tab are positioned on the first side, and the one or more phase AC power tabs are positioned on the second side.

5. The system of claim 1, wherein the power module further comprises a bottom substrate and a top substrate, wherein:
the first negative DC power tab and the second negative DC power tab are positioned on the top substrate; and
the positive DC power tab is positioned on the bottom substrate.

6. The system of claim 5, wherein the power module further comprises a first metal spacer group, a second metal spacer group, a first die group, a second die group, and a third die group, wherein:
the first die group connects a first portion of the top substrate to a first portion of the bottom substrate;
the first metal spacer group connects the first portion of the bottom substrate to a second portion of the top substrate;
the second die group connects the second portion of the top substrate to a second portion of the bottom substrate;
the second metal spacer group connects the second portion of the top substrate to a third portion of the bottom substrate; and
the third die group connects the third portion of the bottom substrate to a third portion of the top substrate.

7. The system of claim 6, wherein the phase switches are implemented on the first die group, the second die group, and the third die group.

8. The system of claim 6, wherein the first metal spacer group is positioned between the first die group and the second die group, and wherein the second metal spacer group is positioned between the second die group and the third die group.

9. The system of claim 1, further comprising a bottom substrate, a top substrate, and one or more metal spacers, wherein the one or more metal spacers connect portions of the top substrate to the bottom substrate, and wherein drain connections of one or more of the phase switches are connected to the bottom substrate.

10. The system of claim 1, wherein the power module further comprises an overmolding.

11. The system of claim 1, further comprising:
the voltage source to supply the DC power to the inverter; and
the motor to receive the AC power from the inverter to drive the motor, wherein the system is provided as a vehicle including the inverter, the voltage source, and the motor.

12. A system comprising:
an inverter to convert DC power from a voltage source to AC power to drive a motor, wherein the inverter includes:
a power module comprising:
phase switches;
a first DC power tab;
a second DC power tab, wherein the first DC power tab and the second DC power tab are connected to the phase switches;
a third DC power tab positioned between the first DC power tab and the second DC power tab and connected to the phase switches; and
one or more phase AC power tabs to receive AC power from the phase switches,
wherein the phase switches comprise a first group, a second group, and a third group,
wherein:

the first group is positioned adjacent to and is connected to the first DC power tab, the second group is positioned adjacent to and is connected to the second DC power tab, the third group is positioned adjacent to and is connected to the third DC power tab, a first distance between the first group and the first DC power tab is the same as a second distance between the second group and the second DC power tab, and the first distance and the second distance are shorter than a third distance between the third group and the third DC power tab.

13. The system of claim 12, wherein the first DC power tab is a positive DC power tab, the second DC power tab is a positive DC power tab, and the third DC power tab is a negative DC power tab.

14. The system of claim 12, wherein the first DC power tab is a negative DC power tab, the second DC power tab is a negative DC power tab, and the third DC power tab is a positive DC power tab.

15. The system of claim 12, further comprising:

the voltage source to supply the DC power to the inverter; and the motor to receive the AC power from the inverter to drive the motor, wherein the system is provided as a vehicle including the inverter, the voltage source, and the motor.

16. A system comprising a power module for an inverter, the power module comprising:

phase switches;

a first negative DC power tab;

a second negative DC power tab, wherein the first negative DC power tab and the second negative DC power tab are connected to the phase switches;

a positive DC power tab positioned between the first negative DC power tab and the second negative DC power tab and connected to the phase switches; and one or more phase AC power tabs to receive AC power from the phase switches, wherein the phase switches comprise a first group, a second group, and a third group, wherein:

the first group is positioned adjacent to and is connected to the first negative DC power tab, the second group is positioned adjacent to and is connected to the positive DC power tab, the third group is positioned adjacent to and is connected to the second negative DC power tab, a first distance between the first group and the first negative DC power tab is the same as a second distance between the third group and the second negative DC power tab, and the first distance and the second distance are shorter than a third distance between the second group and the positive DC power tab.

17. The system of claim 16, wherein the power module further comprises a first side and a second side opposite the first side, and wherein the first negative DC power tab, the positive DC power tab, and the second negative DC power tab are positioned on the first side, and the one or more phase AC power tabs are positioned on the second side.

18. The system of claim 16, wherein the power module further comprises a bottom substrate and a top substrate, wherein:

the first negative DC power tab and the second negative DC power tab are positioned on the top substrate; and the positive DC power tab is positioned on the bottom substrate.

19. The system of claim 18, wherein the power module further comprises a first metal spacer group, a second metal spacer group, a first die group, a second die group, and a third die group, wherein:

the first die group connects a first portion of the top substrate to a first portion of the bottom substrate;

the first metal spacer group connects the first portion of the bottom substrate to a second portion of the top substrate;

the second die group connects the second portion of the top substrate to a second portion of the bottom substrate;

the second metal spacer group connects the second portion of the top substrate to a third portion of the bottom substrate; and the third die group connects the third portion of the bottom substrate to a third portion of the top substrate.

* * * * *